(12) United States Patent
Tsuboyama et al.

(10) Patent No.: US 6,645,579 B1
(45) Date of Patent: Nov. 11, 2003

(54) LIQUID CRYSTAL DEVICE

(75) Inventors: Akira Tsuboyama, Sagamihara (JP); Shinjiro Okada, Isahara (JP); Takao Takiguchi, Setagaya-ku (JP); Takashi Moriyama, Kawasaki (JP); Jun Kamatani, Asao-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 117 days.

(21) Appl. No.: 09/722,648

(22) Filed: Nov. 28, 2000

(30) Foreign Application Priority Data

Nov. 29, 1999 (JP) .......................... 11-337274
Sep. 13, 2000 (JP) ...................... 2000-278743

(51) Int. Cl.$^7$ ............................................. C09K 19/00
(52) U.S. Cl. ....................... 428/1.4; 428/1.1; 252/299.3
(58) Field of Search ............. 428/1.1, 1.4; 252/299.01, 252/299.3

(56) References Cited

U.S. PATENT DOCUMENTS

| | | | | |
|---|---|---|---|---|
| 4,987,255 A | * | 1/1991 | Tsunekawa et al. | 564/119 |
| 5,061,048 A | * | 10/1991 | Hayden et al. | 359/315 |
| 5,207,952 A | * | 5/1993 | Griffin, III | 252/582 |
| 5,319,492 A | * | 6/1994 | Dorn et al. | 359/296 |
| 5,347,394 A | * | 9/1994 | Wakita et al. | 359/326 |
| 5,516,455 A | * | 5/1996 | Jacobine et al. | 252/299.01 |
| 5,766,510 A | * | 6/1998 | Hanna et al. | 252/299.62 |
| 5,834,894 A | * | 11/1998 | Shirasaki et al. | 313/509 |
| 6,013,384 A | * | 1/2000 | Kido et al. | 428/690 |
| 6,159,562 A | * | 12/2000 | Kanbe et al. | 428/1.1 |
| 6,198,217 B1 | * | 3/2001 | Suzuki et al. | 313/504 |
| 6,423,429 B2 | * | 7/2002 | Kido et al. | 428/690 |

FOREIGN PATENT DOCUMENTS

EP     0 742 197    *  5/1996   ......... C07C/49/788

OTHER PUBLICATIONS

C.H. Chen et al., "Recent Developments in Molecular Organic Electroluminescent Materials," 125 *Macromol. Symp.* 1–48 (1997).

Asuka Yamamori et al., "Doped Organic Light Emitting Diodes Having a 650–nm–thick Hole Transport Layer," 72(17) *Applied Physics Letters* 2147–2149 (1998).

Junji Kido, "Bright Organic Electroluminescent Devices Having a Metal–Doped Electron–Injecting Layer," 73(20) *Applied Physics Letters* 2866–2868 (1998).

Neville Boden et al., "First Observation of an n–Doped Quasi–One Dimensional Electrically–Conducting Discotic Liquid Crystal," 116 *J. Am. Chem Soc.* 10807–10808 (1994).

N. Boden et al., "Electron Transport Along Molecular Stacks in Discotic Liquid Crystals," 5 *J. Material Sci.: Materials in Electronic* 83–88 (1994).

* cited by examiner

*Primary Examiner*—Mark F. Huff
*Assistant Examiner*—Jennifer R. Sadula
(74) *Attorney, Agent, or Firm*—Fitzpatrick, Cella, Harper & Scinto

(57) ABSTRACT

A liquid crystal device, suitably included in e.g., an organic EL device, is formed of a pair of electrodes and a plurality of layers disposed between the electrodes and including at least one liquid crystal layer. The liquid crystal layer comprises a liquid crystal composition having an electronic carrier-transporting function and comprising at least two compounds including at least one electron-donating compound or electron-accepting compound having a π-electron conjugated structure. As a result of doping the liquid crystal layer with the electron-donating or electron-accepting compound, the current conduction performance of the liquid crystal layer is improved presumably due to the generation of free carriers therein, whereby a functional device including the liquid crystal device can be improved as a whole.

12 Claims, 2 Drawing Sheets

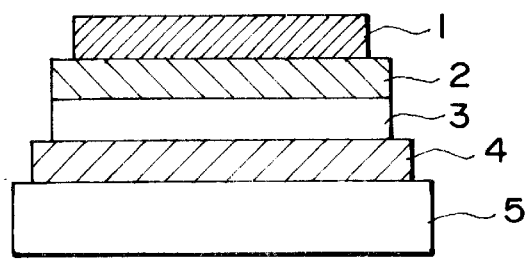
F I G. 1A
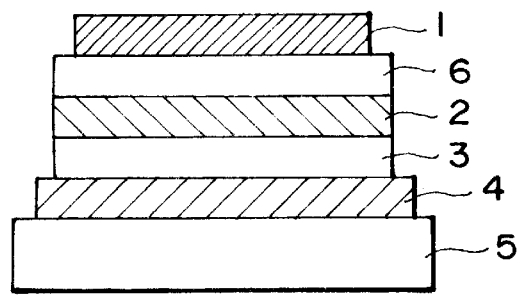
F I G. 1B
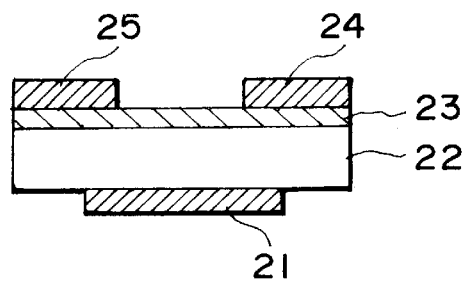
F I G. 2
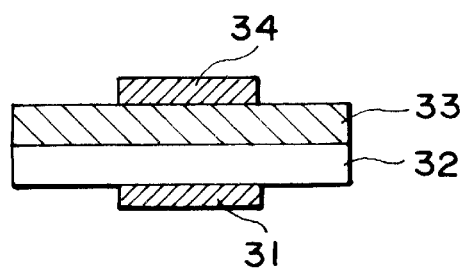
F I G. 3

LIQUID CRYSTAL DEVICE

BACKGROUND OF THE INVENTION

The present invention relates to a liquid crystal device utilizing a self-alignment characteristic and electroconductivity of a liquid crystal, more specifically a liquid crystal device used in electronic devices, such as an organic electroluminescence device including a carrier-transporting layer comprising a liquid crystal and transistors or diodes utilizing the electroconductivity of a liquid crystal.

Extensive study is being made on the applied uses of an organic electroluminescence device (hereinafter sometimes called an "organic EL device") as a high speed response and high efficiency luminescence device. Such an organic EL device basically has a sectional structure as shown in FIG. 1A or 1B including a metal electrode 1, a luminescence layer 2, a hole-transporting layer 3, a transparent electrode 4, a transparent substrate 5, and an electron-transporting layer 6, e.g., as disclosed in Macromol. Symp., vol. 125, pp. 1–48 (1997).

As shown in FIGS. 1A and 1B, the organic EL device generally has a laminated structure comprising a transparent substrate 5, a transparent electrode 4 and a metal electrode 1, between which one or more organic layers are disposed. The structure of FIG. 1A includes a luminescence layer 2 and a hole-transporting layer 3 as the organic layers. The transparent electrode 4 may comprise a transparent conductor having a large work function, such as ITO (indium tin oxide), so as to exhibit a good hole-injection characteristic from the transparent electrode 4 to the hole-transporting layer 3. The metal electrode 1 may comprise a metal material having a small work function, such as aluminum, magnesium or an alloy of these, so as to exhibit a good electron-injection characteristic to the organic layers. These electrodes may have a thickness of ca. 50–200 nm.

In the organic EL device of FIG. 1A, the luminescence layer 2 typically comprises an aluminum quinolinol complex derivative, representatively Alq3 (tris(8-quinolinolato) aluminum) represented by a formula shown below, having both electron-transportation and luminescence characteristics Further, the hole-transporting layer 3 may comprise an electron-donative material, e.g., a triphenyldiamine derivative, representatively α-NPD (bis[N-(1-naphthyl)-N-phenyl]benzidine of a formula shown below.

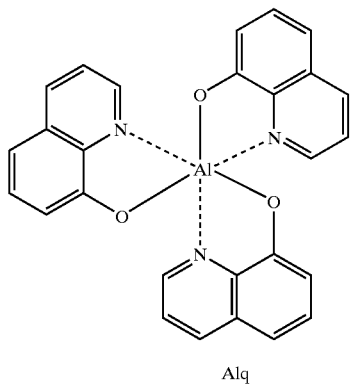

Alq

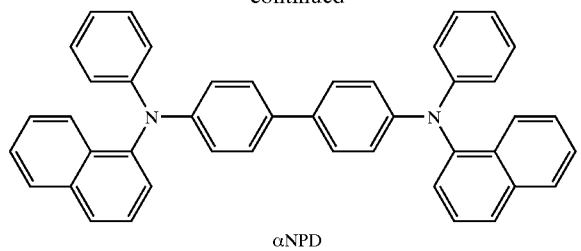

αNPD

An organic EL device having a structure as described above shows a rectifying characteristic, and when a voltage is applied between the metal electrode 1 as a cathode and the transparent electrode 4 as an anode, electrons are injected from the metal electrode 1 into the luminescence layer 2 and holes are injected from the transparent electrode 4. The holes and electrons injected to the luminescence layer 2 are recombined in the luminescence layer 2 to form excitons, which cause luminescence. In this instance, the hole-transporting layer 3 functions as a layer for blocking electrons to provide a higher recombination efficiency at the luminescence layer/hole-transporting layer boundary, thereby providing an enhanced luminescence efficiency.

In the structure of FIG. 1B, an electron-transporting layer 6 is disposed between the metal electrode 1 and the luminescence layer 2 in the structure of FIG. 1A. According to this structure, the luminescence function is separated from the functions of both electron transportation and hole transportation, to provide a structure exhibiting more effective carrier blocking, thus realizing more efficient luminescence. The electron-transporting layer 6 may comprise, e.g., an oxadiazole derivative.

The organic layers (including the luminescence layer 2, hole-transporting layer 3 and electron-transporting layer 6 may have a thickness of 50–500 nm in total of the two or three layers.

In the above-mentioned organic EL devices, the luminescence performance is critically determined by the performance of injection of electrons and/or holes from the electrodes. The above-mentioned amorphous materials, such as Alq and α-NPD, are not believed to provide sufficient carrier injection performances in view of the resultant electrode-organic layer boundaries.

Accordingly, liquid crystal materials have been expected to provide new electron-transporting layer and/or luminescence layer materials exhibiting high carrier injection performance and high mobility.

Liquid crystal materials exhibiting a high carrier-transporting performance may include liquid crystals having a discotic liquid crystal phase or a high-order smectic phase, i.e., discotic liquid crystals and smectic liquid crystals.

Examples of the discotic liquid crystals may include triphenylene-type liquid crystals having structures as shown below (as disclosed in Adv. Mater., vol. 8, No. 10 (1996)). The below-indicated LC Compounds 1–4 having side chains or substituents R of alkoxy groups —$OC_4H_9$, —$OC_5H_{11}$ and —$OC_6H_{13}$ and a thio-ether group —$SC_6H_{13}$ are known to exhibit a hole-transporting performance at a high carrier mobility (on the order of $10^{-1}$–$10^{-3}$ cm/Vs). These compounds exhibit a discotic columnar phase, wherein disk-shaped liquid crystal molecules are aligned to form a columnar shape so that their triphenylene skeletons rich in π-electrons are mutually superposed, thus exhibiting a good hole-transporting characteristic via the triphenylene group.

LC Compound 5 shown below was developed by our research group and, because of poly-fluorinated side chains, exhibits a discotic liquid crystal phase range shifted to a lower temperature side and a lower ionization potential than the corresponding non-fluorinated compound. LC Compound 7 has a dibenzopyrene skeleton and also exhibits a discotic columnar phase.

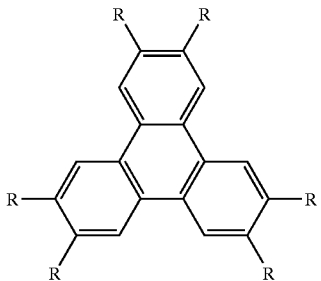

LC Compound 1: R=SC$_6$H$_{13}$
LC Compound 2: R=OC$_4$H$_9$
LC Compound 3: R=OC$_5$H$_{11}$
LC Compound 4: R=OC$_6$H$_{13}$
LC Compound 5: R=OC$_4$H$_8$C$_2$F$_5$

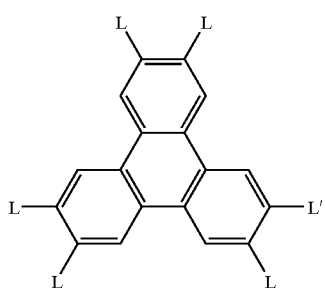

LC Compound 6: L=OC$_5$H$_{11}$

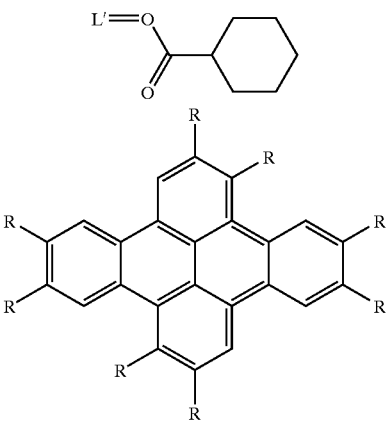

LC Compound 7: R=OC$_5$H$_{11}$

Other discotic liquid crystals may include those having skeletons of phthalocyanine derivatives, naphthalocyanine derivatives, truxene derivatives, hexabenzocolonene derivatives and benzoquinone derivatives.

Representative smectic liquid crystal materials may include LC Compounds 8–11 shown below (as disclosed by Ohyou Butsuri, Appl. Phys., vol. 68, no. 1, p. 26 (1999)).

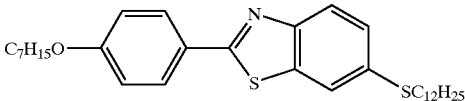

LC Compound 8

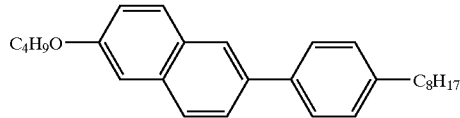

LC Compound 9

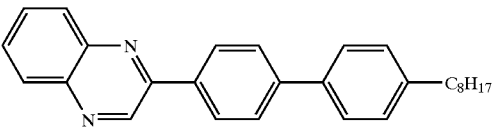

LC Compound 10

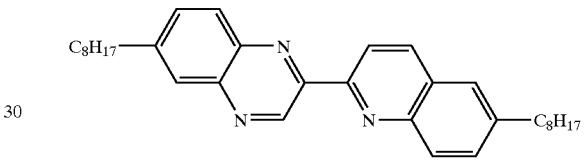

LC Compound 11

LC Compound 8 shown above, classified as a phenylbenzothiazole derivative and showing smectic A phase, has a hole-transporting characteristic. LC Compound 9, classified as a phenylnaphthalene derivative, shows smectic A phase and smectic E phase and a higher mobility in the smectic E phase of a higher order than the smectic A phase. LC Compound 9 also exhibits bipolar carrier (i.e., hole and electron)-transporting characteristic. LC Compounds 8 and 9 both show a high mobility of $10^{-3}$ cm/V·s or higher.

Other liquid crystal compounds having a bar-shaped skeleton and showing a smectic liquid crystal phase may also be used.

Such a liquid crystal compound, when used in the electron- or hole-transporting layer 3 or 6 of the structures shown in FIGS. 1A and 1B, is expected to provide a device of an improved performance at a good productivity.

The characteristics of a carrier-transporting liquid crystal material may be summarized as (i) a high carrier mobility due to self-alignment characteristic in the bulk state and (ii) a high carrier-injection characteristic due to a π-electron conjugated plane aligned parallel to the electrode boundary, which are not possessed by the conventional materials.

We have further studied whether more effective luminescence can be attained by generating carriers in an organic layer in addition to carrier injection from the electrodes. Hitherto, several studies have been reported regarding the doping of a carrier-transporting material with an electron-accepting or electron-donating compound in an organic layer, e.g., in (1) Yamamoto, et al., Appl. Phys. Lett., vol. 72, no. 17, p. 2147 (1998) and (2) Kido, et al., Appl. Phys. Lett., vol. 73, no. 20, p. 2866 (1998).

The above reference (1) reports that a polymeric material constituting a hole-transporting layer is doped with 20 mol.

% of a salt containing $SbCl_6^-$ so as to generate holes and increase the carrier density in the hole-transporting polymeric material, thereby succeeding in high luminance emission. The above reference (2) reports an improvement in electron injection performance by doping an electron-transporting layer with Li metal.

Doping of liquid crystals has been reported, e.g., in (3) Boden, et al., J. Am. Chem. Soc., vol. 116, no. 23, p. 10808 (1994) and (4) J. Mater. Sci.: Materials in Electronics, vol. 5, p. 83 (1994).

The above reference (3) reports that a discotic liquid crystal material having a tricycloquinazoline is doped with 6 mol. % of potassium to provide an n-type semiconduction for transporting electrons as a principal carrier. The reference (4) reports that a discotic liquid crystal material having a triphenylene skeleton is doped with $AlCl_3$ to provide a p-type semiconductor for transporting holes as a principal carrier.

In the case where an electronic device including a layer of liquid crystal material doped with an inorganic material is supplied with an external electric field, not only electronic carriers (holes or electrons) but also ionic (anionic or cationic) dopants are moved in the liquid crystal layer under the external electric field, thus causing an ionic current. The ionic current is caused by the movement of the dopants per se and thus results in a poor reversibility of current characteristic, thus leaving problems in not only initial performance but also long-term performance. Particularly, in the case of a liquid crystal material having a liquid characteristic, the ionic current problem is liable to be more serious than in the case of amorphous or polymeric materials. The above-mentioned references (3) and (4) were both directed to a device including a liquid crystal layer alone of which the voltage-current characteristic was measured as a basic property, so that a serious problem was not believed to be encountered even if an ionic current and an electronic current were both present.

SUMMARY OF THE INVENTION

In view of the above-mentioned problems, a principal object of the present invention is to obtain a liquid crystal composition by utilizing an effective doping technique stably applicable to a liquid crystal and provide a liquid crystal device capable of constituting an electronic device showing good performances by using the liquid crystal composition.

According to the present invention, there is provided a liquid crystal device comprising a pair of electrodes and a plurality of layers disposed between the electrodes and including at least one liquid crystal layer, which comprises a liquid crystal composition having an electronic carrier-transporting function and comprising at least two compounds including at least one electron-donating compound or electron-accepting compound having a π-electron conjugated structure.

In the liquid crystal device according to the present invention, the liquid crystal layer included therein and having an electronic carrier-transporting function contains an electron-donating compound or an electron-accepting compound having a π-electron conjugated structure, whereby carriers can be stably formed by mutual interaction with another compound therein. As a result, the liquid crystal is effectively and stably doped to exhibit a good electronic current characteristic. According to the present invention, it becomes possible to realize an electronic device, such as a semiconductor device or a luminescence device, exhibiting remarkably improved performances.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are schematic sectional views showing basic organizations of organic EL devices.

FIG. 2 is a schematic sectional view of a MOS-type FET device including a liquid crystal device structure of the invention.

FIG. 3 is a schematic sectional view of a diode including a liquid crystal device structure of the invention.

DESCRIPTION OF THE PREFERRED EMBODIMENTS

Figure 4:
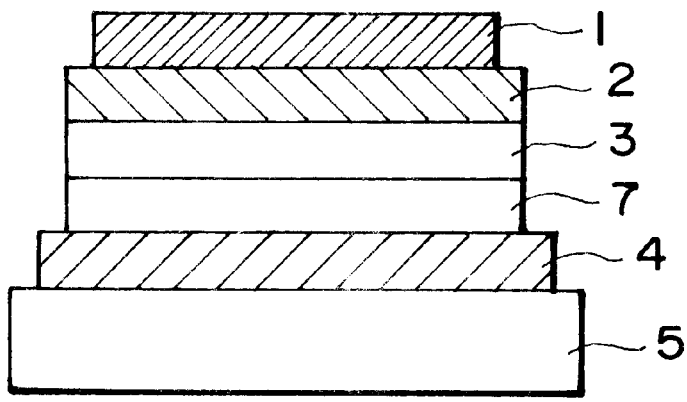
FIGS. 4 and 5 are schematic sectional views, each showing an organization of an organic EL device.

The present invention aims at providing a high performance liquid crystal device by utilizing a good current characteristic of a liquid crystal attributable to a high degree of order resulting from a self-alignment characteristic of the liquid crystal, particularly by using a liquid crystal composition comprising plural compounds.

The significance of using a liquid crystal compound for constituting various semiconductors will now be discussed to some extent in comparison with an Si crystal semiconductor. Si crystal has a band gap of ca. 1.1 eV and is generally doped with electron-donating or electron-accepting atoms to increase the density of electrons in the conduction band or holes in the valence band, thus generating free carriers. By using these techniques, various functional devices are provided while adopting various combinations of pn-junctions, etc.

On the other hand, a liquid crystal compound generally has a band gap of 2–3 eV, and the density of thermally excited free carriers is low. In the case of an organic EL device operated by utilizing externally injected electrons and holes as carriers, a liquid crystal compound having a low density of free carriers can be used, and a still higher efficiency can be expected by doping the liquid crystal compound so as to realize a higher current density and a higher luminance.

Thus, in order to increase the utility of a liquid crystal compound, an appropriate proportion of an electron-donating or electron-accepting compound is blended so as to provide a p-type or n-type semiconductor in the present invention.

FIG. 2 is a schematic sectional view of a MOS (metal oxide semiconductor)-type FET (field effect transistor) device using a liquid crystal layer as an example of a transistor including a liquid crystal device structure of the present invention. Referring to FIG. 2, the device includes a gate electrode 21, a gate insulating film 22, an organic active layer 23, a drain electrode 24 and a source electrode 25. In this device, the organic active layer 23 is formed of a liquid crystal composition. The other members are similar to the corresponding members in a conventional MOS-type FET device. The liquid crystal composition may constitute, e.g., an n-type semiconductor layer by incorporating a certain proportion of an electron-donating compound. In this instance, a current is caused to flow between the source 25 and the drain 24 when a positive voltage exceeding a threshold is applied to the gate electrode 21.

FIG. 3 is a schematic sectional view of an example of a diode including a liquid crystal device structure of the present invention. Referring to FIG. 3, the diode includes electrodes 31 and 34, between which a p-type semiconductor layer 32 and an n-type semiconductor layer 33 are disposed. In this device, the electrodes 31 and 34 are similar to those in a conventional diode, and the p-type semiconductor layer 32 and the n-type semiconductor layer 33 are respectively formed of a liquid crystal composition by incorporating an electron-accepting compound in the p-type semiconductor layer 32 and an electron-donating compound in the n-type semiconductor layer 33. The device shows a rectifying characteristic so that a current flows in the case where a voltage is applied between the electrodes 31 and 34 with the electrode 31 as a positive electrode.

In the liquid crystal device of the present invention, a satisfactory performance cannot be attained if impurities exceeding a certain level are contained in the liquid crystal layer so as to function as a carrier trap. Such impurities may include organic by-products formed during the synthesis of a liquid crystal compound and can be basically removed by re-crystallization and sublimation for purification. It is indispensable to reduce the impurity concentration to below a certain level in order to provide a high performance device. Especially in the case of doping, the device performance is greatly affected by a concentration of impurities other than the dopant. Accordingly, in the present invention, the impurity concentration of a liquid crystal compound before doping should be suppressed to at most 1 wt. %, as measured by high performance liquid chromatography (HPLC).

Dopants to be added to liquid crystal compounds may be generally classified into inorganic compounds and organic compounds (having a π-electron conjugated structure), and the organic compounds are used as the dopant in the present invention, inclusive of an electron-donating compound having a low ionization potential and an electron-accepting compound having a large electron affinity.

More specifically, the liquid crystal composition used in the present invention has an electronic carrier-transporting function and comprises at least two compounds including at least one compound which is an electron-donating compound or an electron-accepting compound respectively having a π-electron conjugated compound.

The electron-donating compound may preferably have an ionization potential $Ip^D$ satisfying the following relationship with an ionization potential $Ip^{LC}$ of another compound constituting the liquid crystal composition:

$Ip^D-Ip^{LC}-0.3$ eV.

On the other hand, the electron-accepting compound may preferably have an ionization potential $Ip^A$ satisfying the following relationship with an ionization potential $Ip^{LC}$ of another compound constituting the liquid crystal composition:

$Ip^A-Ip^{LC}>0.3$ eV.

By using an electron-donating compound or an electron-accepting compound satisfying the above requirement, it becomes possible to stably generate free carriers in the liquid crystal composition.

Specific examples of the electron-donating compound and the electron-accepting compound useful in the present invention are enumerated hereinbelow.

Electron-donating Compounds
Compound 11: TTF (tetrathiafulvalene)

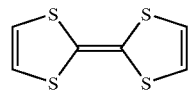

Compound 12: TMTSF (tetramethyltetraselenium-fulvalene)

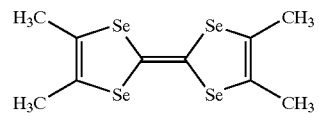

Compound 13: TFT-based liquid crystal

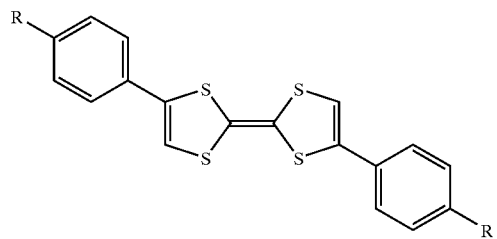

R: alkyl, alkoxy, etc.
Compound 14: tetraphenylbipyranylidene compound

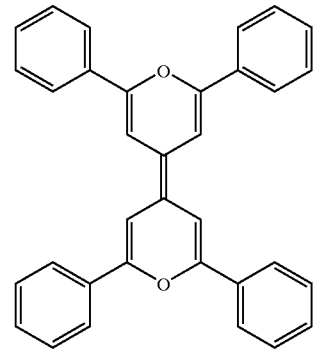

Compound 15: tetraphenylbipyranylidene-based liquid crystal compound

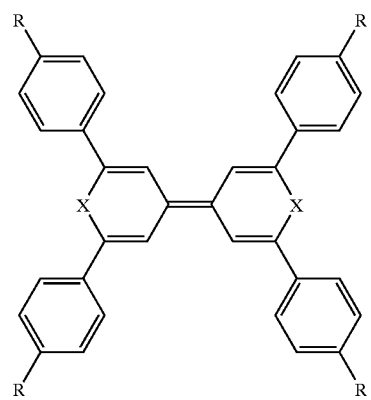

X: O or S
R: alkyl or alkoxy

Electron-accepting Compounds

Compound 21: TCNQ (tetracyanoquinodimethane)

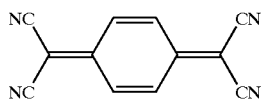

Compound 22: TCNE (tetracyanoethylene)

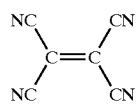

Compound 23: biquinonylidene compound

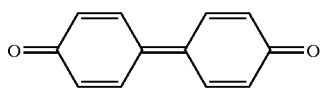

Compound 24: dithiolene-based nickel complex liquid crystal compound

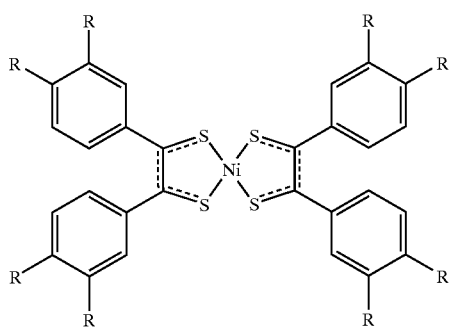

R: alkyl, alkoxy, etc.

As mentioned above, the inorganic dopants (inclusive of electron-donating materials comprising metals, such as Li, Na, K and Cs, and electron-accepting materials, such as $Br_2$, $I_2$, $Cl_2$, $BF_3$, $PF_5$, $SbF_5$, $SO_3$, $FeCl_3$ and $AlCl_3$) have only a relatively small volume compared with the liquid crystal compounds and the above-mentioned organic dopants. Liquid crystal compound molecules are aligned in stacked forms for their skeletons and side chains, respectively. Accordingly, ionized small molecules of such an inorganic dopant particularly present at the side chains of the host liquid crystal molecules are liable to move under an electric field, so that the resultant ionic current cannot be negligible.

On the other hand, the organic dopants used in the present invention have a molecular volume comparable to or even larger than the volume of a skeleton part of the host liquid crystal compound and cause a charge transfer due to π-electron interaction to generate carriers. As a result, the host liquid crystal and the dopant are bonded by a relatively strong interaction to form a charge transfer complex. Accordingly, an organic dopant is not liable to move, thus resulting in only a negligible level of ionic current and providing a durable and reliable device. As the organic dopant, it is also possible to use a liquid crystal compound as mentioned above.

Further, it is possible to form a more stably functioning device by disposing a layer of a compound capable of transporting a species of carrier (holes or electrons) identical to the principal species of carrier transported by the doped liquid crystal layer in lamination with the liquid crystal layer. The additional layer functions as a protective layer for preventing diffusion of the dopant. In the absence of such a protective layer, luminescence can be obstructed as by obstruction of electron transfer, e.g., due to diffusion of a doping electron-accepting compound in a hole-transporting liquid crystal layer to an electron-transporting compound to form a new electron level. This problem can be obviated by disposing such an identical species carrier-transporting layer in lamination with the doped liquid crystal layer.

As is well known, in a device using Si crystal, such an Si crystal layer has to be formed by strict crystal growth. This is costly and poses a serious difficulty in producing a large area device. The liquid crystal layer used in the liquid crystal device of the present invention can be formed with high productivity by co-vapor deposition according to the vacuum deposition process or by application such as spin coating due to a self-aligning characteristic and alignment order of the liquid crystal which is close to that of a crystal. Accordingly, a high performance electronic device can be realized at a low cost. Moreover, as the self-alignment characteristic allows easy production of a large area device, it becomes possible to prepare such a large area device which could not otherwise be achieved using conventional Si crystal.

Hereinbelow, the present invention will be more specifically described with reference to Examples and Comparative Examples.

EXAMPLE 1

An organic EL device having an organization as shown in FIG. 4 (wherein identical numerals represent identical layers as in FIG. 1A) and including a hole-injection layer 7 was prepared using a liquid crystal composition formed by doping LC Compound 4 mentioned above with 1 mol. % of Compound 21 (TCNQ) as an electron-accepting dopant for the hole-injection layer 7. The liquid crystal composition, as well as LC Compound 4, exhibited a phase transition from crystal phase to discotic columnar disordered phase at ca. 65° C. on temperature increase.

First, a glass substrate 5 coated with a 70 nm-thick ITO film 4 was further coated with a 1 wt. % chloroform solution of the above liquid crystal composition by spin coating at 1000 rpm for 20 seconds, followed by drying to form a 60 nm-thick liquid crystal layer (hole-injection layer) 7.

The hole-injection layer 7 was further coated with a 20 nm-thick hole-transporting amorphous layer 4 of α-NPD and with a 50 nm-thick luminescence layer of Alq3, respectively, by vacuum deposition at a rate of 0.2 nm under resistance heating at a vacuum of at most $1.06 \times 10^{-3}$ Pa. Further, thereon, a 10 nm-thick layer of Al/1.8 wt. % Li alloy and a 100 nm-thick Al layer were formed by vacuum deposition at a vacuum of at most $1.06 \times 10^{-3}$ Pa to form a cathode 1, thereby providing an organic EL device as shown in FIG. 4.

COMPARATIVE EXAMPLE 1

An organic EL device having an organization as shown in FIG. 4 was prepared in the same manner as in Example 1, except that a hole-injection layer 7 was formed of LC Compound 4 alone without the electron-accepting dopant (Compound 21).

The above-prepared devices of Example 1 and Comparative Example 1 were supplied with a DC voltage of 10 volts with the ITO 4 as the anode at 30° C. (crystal phase) and 70°

C. (liquid crystal phase) respectively, whereby the following current values were exhibited.

|  | 30° C. | 70° C. |
|---|---|---|
| Example 1 | 4 mA/cm² | 30 mA/cm² |
| Comparative Example 1 | 0.5 mA/cm² | 5c mA/cm² |

The device of Example 1 exhibited improved current characteristics due to spontaneous alignment in the liquid crystal phase (30° C.→70° C.) and also free carrier generation by addition of the dopant. The increase in current was accompanied with an almost proportional increase in emission luminance. The device of Example 1 also exhibited good and stable luminescence in a continual current conduction durability test in a nitrogen atmosphere.

EXAMPLE 2

An organic EL device having a structure as shown in FIG. 1B was prepared in the following manner.

A glass substrate 5 coated with a 70 nm-thick ITO film 4 was further coated with a 50 nm-thick layer 3 of α-NPD and a 40 nm-thick layer 2 of Alq3, respectively, by vacuum deposition. Further thereon, a 20 nm-thick layer 6 of liquid crystal composition comprising LC Compound 5 and Compound 11 (TTF) as an electron-donating dopant in a ratio of 200:1 was formed by co-vacuum deposition under a condition giving a thickness ratio of 200:1 by preliminary separate vacuum deposition tests. Further thereon, a cathode 1 of AlLi/Al laminate structure was formed by vacuum deposition in the same manner as in Example 1.

COMPARATIVE EXAMPLE 2

An organic EL device was prepared in the same manner as in Example 2, except that an electron-transporting layer 6 was formed of LC Compound 5 alone.

The above-prepared organic EL devices of Example 2 and Comparative Example 2 were respectively supplied with a DC voltage of 10 volts with the ITO 5 as the anode, whereby the following current values were measured.

|  | 30° C. |
|---|---|
| Example 2 | 8 mA/cm² |
| Comparative Example 2 | 1.5 mA/cm² |

Incidentally, the liquid crystal composition and LC Compound 5 assumed smectic liquid crystal phase at 30° C. as a supercooled state. As shown above, the device of Example 2 having a liquid crystal layer with a dopant exhibited a substantially better current characteristic.

EXAMPLE 3, COMPARATIVE EXAMPLE 3

Organic EL devices were prepared in the same manner as in Example 2 and Comparative Example 2, respectively, except that LC Compound 5 was replaced by LC Compound 10.

The above-prepared organic EL devices of Example 3 and Comparative Example 3 were respectively supplied with a DC voltage of 10 volts with the ITO 5 as the anode, whereby the following current values were measured.

|  | 30° C. |
|---|---|
| Example 3 | 11 mA/cm² |
| Comparative Example 3 | 2 mA/cm² |

Incidentally, the liquid crystal composition and LC Compound 10 assumed smectic liquid crystal phase at 30° C. as a supercooled state. As shown above, the device of Example 3 having a liquid crystal layer with a dopant exhibited a substantially better current characteristic.

EXAMPLE 4, COMPARATIVE EXAMPLE 4

Organic EL devices were prepared in the same manner as in Example 2 and Comparative Example 2, respectively, except that LC Compound 5 was replaced by LC Compound 11.

The above-prepared organic EL devices of Example 4 and Comparative Example 4 were respectively supplied with a DC voltage of 10 volts with the ITO 5 as the anode, whereby the following current values were measured.

|  | 30° C. |
|---|---|
| Example 4 | 6 mA/cm² |
| Comparative Example 4 | 0.5 mA/cm² |

Incidentally, the liquid crystal composition and LC Compound 11 assumed smectic liquid crystal phase at 30° C. as a supercooled state. As shown above, the device of Example 4 having a liquid crystal layer with a dopant exhibited a substantially better current characteristic.

EXAMPLE 5

Four types of organic EL devices were prepared in the same manner as in Example 1, except that LC Compound 4 as a principal component of the liquid crystal composition having 4 different levels of purity, i.e., 98.2 wt. %, 98.8 wt. %, 99.2 wt. % and 99.5 wt. %, respectively, was used.

A liquid crystal compound can have different degrees of purity through different degrees of purification after its synthesis. The above four levels of purity were obtained by changing the conditions of column chromatography and re-crystallization and measured by HPLC (high performance liquid chromatography) according to the following conditions.

| Column: | "Crestpak C18S" (reverse phase), mfd. by Nippon Bunko K.K. |
|---|---|
| Eluent: | methanol |
| HPLC purity detection wavelength: | 280 nm |

In view of the synthesis process, it is believed that substantially all of the impurities could be detected.

The four lots of LC Compound 4 having different impurities were respectively doped with 1 mol. % of Compound 21 as an electron-accepting dopant to respectively provide a hole-transporting layer.

The current values of the thus-prepared four organic EL devices were measured under application of a DC voltage of 10 volts at 70° C. The results are shown below corresponding to LC Compound 4 purity.

| Purity | Current (at 70° C.) |
| --- | --- |
| 98.2 (wt. %) | 5 (mA/cm$^2$) |
| 98.8 | 7 |
| 99.2 | 30 |
| 99.5 | 26 |

The above results show that a liquid crystal compound should have a purity of at least 99.0 wt. %, as measured by HPLC, before it is doped with an electron-donating or -accepting compound. Incidentally, the liquid crystal compounds used in Examples 1–4 all had purities of 99.5 wt. % or higher.

EXAMPLE 6

Figure 5:
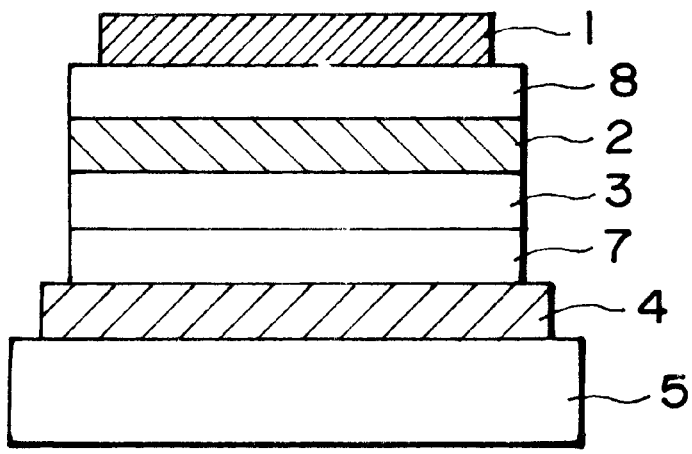

An organic EL device having an organization as shown in FIG. 5 (further including an electron-injection layer 8 between the luminescence layer 2 and the cathode 1 in the device of FIG. 4 (Example 1)).

Thus, the procedure of Example 1 was repeated up to the formation of the 50 nm-thick luminescence layer of Alq3. Further thereon, a 20 nm-thick layer 8 of liquid crystal composition comprising LC Compound 5 and Compound 11 (TFT) as an electron-donating dopant in a ratio of 200:1 was formed as an electron-injection layer by co-vacuum deposition under a condition giving a thickness ratio of 200:1 by preliminary separate vacuum deposition tests. Further thereon, a cathode 1 of AlLi/Al laminate structure was formed by vacuum deposition in the same manner as in Example 1.

The above-prepared device was supplied with a DC voltage of 10 volts with the ITO 4 as the anode at 30° C. and 70° C. similarly as in Example 1. The measured current values are shown below in parallel with those of Example 1.

|  | 30° C. | 70° C. |
| --- | --- | --- |
| Example 6 | 5 mA/cm$^2$ | 50 mA/cm$^2$ |
| Example 1 | 4 mA/cm$^2$ | 30 mA/cm$^2$ |

As shown above, the organic EL device of Example 6 further including an electron-injection layer 8 comprising a layer of liquid crystal doped with an electron-donating dopant (Compound 11) exhibited an even better current characteristic than the device of Example 1.

What is claimed is:

1. A liquid crystal device comprising:
   a pair of electrodes, and
   a plurality of layers disposed between the electrodes and including at least one liquid crystal layer,
   wherein said at least one liquid crystal layer comprises a liquid crystal composition having an electronic carrier-transporting function and
   wherein said liquid crystal composition comprises at least two compounds including at least one liquid crystal compound capable of assuming a liquid crystal phase by itself and at least one organic dopant having a π-electron conjugated structure which is an electron-donating compound or an electron-accepting compound, said liquid crystal compound and said organic dopant being bonded to form a charge transfer complex in said at least one liquid crystal layer.

2. The liquid crystal device according to claim 1, wherein said liquid crystal device functions as an organic electroluminescence device.

3. The liquid crystal device according to claim 1, wherein said liquid crystal compound has an impurity concentration of at most 1 wt. % as measured by high performance liquid chromatography.

4. The liquid crystal device according to claim 1, wherein said liquid crystal layer has been formed by co-vacuum deposition of said at least two compounds forming the liquid crystal composition.

5. The liquid crystal device according to claim 1, wherein said liquid crystal layer has been formed by application of the liquid crystal composition by spin coating.

6. The liquid crystal device according to claim 1, wherein the liquid crystal composition is placed in a smectic liquid crystal phase.

7. The liquid crystal device according to claim 1, wherein the liquid crystal composition is placed in a discotic liquid crystal phase.

8. The liquid crystal device according to claim 1, wherein the liquid crystal layer is disposed in plural layers.

9. The liquid crystal device according to claim 8, wherein the plural layers include one liquid crystal layer containing the electron-donating compound having a π-electron conjugated structure and another liquid crystal layer containing the electron-accepting compound having a π-electron conjugated structure.

10. The liquid crystal device according to claim 1, wherein the liquid crystal composition contains the electron-donating compound having an ionization potential $Ip^D$ and another compound having an ionization potential $Ip^{LC}$ satisfying a relationship of $Ip^D - Ip^{LC} < -0.3$ eV.

11. The liquid crystal device according to claim 1, wherein the liquid crystal composition contains the electron-accepting compound having an ionization potential $Ip^A$ and another compound having an ionization potential $Ip^{LC}$ satisfying a relationship of $Ip^A - Ip^{LC} > 0.3$ eV.

12. The liquid crystal device according to claim 1, wherein said plurality of layers includes a carrier-transporting layer disposed in contact with the liquid crystal layer and comprising a compound capable of transporting carrier species identical to carrier species that is principally transported by the liquid crystal layer.

* * * * *

UNITED STATES PATENT AND TRADEMARK OFFICE
CERTIFICATE OF CORRECTION

PATENT NO. : 6,645,579 B1
DATED : November 11, 2003
INVENTOR(S) : Tsuboyama et al.

It is certified that error appears in the above-identified patent and that said Letters Patent is hereby corrected as shown below:

Title page,
Item [56], References Cited, OTHER PUBLICATIONS, after "Neville Boden et al.", "Quasi-One Dimensional" should read -- Quasi-One-Dimensional -- and after "N. Boden et al.", "*Electronic*" should read -- *Electronics* --.
Item [75], Inventors, "Jun Kamatani, Asao-ku (JP)" should read -- Jun Kamatani, Kawasaki (JP) --.

Column 2,
Line 19, "to" should read -- into --.

Column 7,
Line 51, "$Ip^D\text{-}Ip^{LC}\text{-}0.3$ eV." should read -- $Ip^D\text{-}Ip^{LC}<-0.3$ eV. --.

Column 13,
Line 58, "function and" should read -- function, and --.

Signed and Sealed this

Twenty-seventh Day of April, 2004

JON W. DUDAS
*Acting Director of the United States Patent and Trademark Office*